United States Patent
Fu et al.

(10) Patent No.: US 10,416,379 B2
(45) Date of Patent: Sep. 17, 2019

(54) ARRAYED WAVEGUIDE GRATING BASED HYBRID INTEGRATED LASER HAVING ADJUSTABLE EXTERNAL CAVITY

(71) Applicant: Accelink Technologies Co., Ltd., Wuhan (CN)

(72) Inventors: Yanfeng Fu, Wuhan (CN); Kun Qian, Wuhan (CN); Di Zhang, Wuhan (CN); Xuesheng Tang, Wuhan (CN); Shenglei Hu, Wuhan (CN); Yi Tang, Wuhan (CN); Di Li, Wuhan (CN); Weidong Ma, Wuhan (CN); Qianggao Hu, Wuhan (CN)

(73) Assignee: Accelink Technologies Co., Ltd. (CN)

( * ) Notice: Subject to any disclaimer, the term of this patent is extended or adjusted under 35 U.S.C. 154(b) by 8 days.

(21) Appl. No.: 15/541,659

(22) PCT Filed: Dec. 29, 2014

(86) PCT No.: PCT/CN2014/095333
§ 371 (c)(1),
(2) Date: Jul. 5, 2017

(87) PCT Pub. No.: WO2016/095265
PCT Pub. Date: Jun. 23, 2016

(65) Prior Publication Data
US 2018/0172907 A1    Jun. 21, 2018

(30) Foreign Application Priority Data
Dec. 19, 2014 (CN) .......................... 2014 1 0802244

(51) Int. Cl.
*G02B 6/12* (2006.01)
*H01S 5/068* (2006.01)
*H01S 5/14* (2006.01)

(52) U.S. Cl.
CPC ..... *G02B 6/12019* (2013.01); *G02B 6/12004* (2013.01); *G02B 6/12014* (2013.01); *H01S 5/068* (2013.01); *H01S 5/142* (2013.01)

(58) Field of Classification Search
CPC .. G02B 6/12019; G02B 6/12033; G02B 6/34; G02B 6/4203; G02B 6/4214;
(Continued)

(56) References Cited

U.S. PATENT DOCUMENTS 7,079,718 B2 *  7/2006  Welch ................... B82Y 20/00
                                                          385/14
7,565,084 B1 *  7/2009  Wach ................... H04B 10/506
                                                          398/183
(Continued)

FOREIGN PATENT DOCUMENTS

CN    101202409 A    6/2008
CN    102354909 A    2/2012
(Continued)

OTHER PUBLICATIONS

International Search Report for Application No. PCT/CN2014/095333 dated Aug. 27, 2015.

*Primary Examiner* — Thomas A Hollweg
*Assistant Examiner* — Mary A El-Shammaa
(74) *Attorney, Agent, or Firm* — Lerner, David, Littenberg, Krumholz & Mentlik, LLP

(57) ABSTRACT

An arrayed waveguide grating based hybrid integrated laser has an adjustable external cavity. The waveguide includes a semiconductor gain die and an optical waveguide chip. The optical waveguide chip includes an arrayed waveguide grating and an arrayed waveguide reflection-controllable component. A resonant cavity is formed by the output end reflection-controllable arrayed waveguide grating chip and the semiconductor gain die. An output wavelength of the laser can be adjusted by changing a driving condition of the
(Continued)

reflection-controllable component. The output wavelength is determined by a center wavelength of each channel of the arrayed waveguide grating.

8 Claims, 4 Drawing Sheets

(58) Field of Classification Search
CPC . G02B 6/12004; G02B 6/12014; H01S 5/068; H01S 5/142
See application file for complete search history.

(56) References Cited

U.S. PATENT DOCUMENTS

| | | |
|---|---|---|
| 2004/0075886 A1 | 4/2004 | Brasseur et al. |
| 2007/0002924 A1* | 1/2007 | Hutchinson ............. H01S 5/141 372/98 |
| 2014/0185980 A1* | 7/2014 | Lei ..................... G02B 6/12004 385/14 |
| 2016/0036550 A1* | 2/2016 | Welch .................. G02B 6/4215 398/87 |
| 2017/0163369 A1* | 6/2017 | Welch ................. H04J 14/0221 |
| 2017/0170898 A1* | 6/2017 | Fu ................... H04B 10/07957 |
| 2018/0069649 A1* | 3/2018 | Welch ................. H04J 14/0221 |

FOREIGN PATENT DOCUMENTS

| | | |
|---|---|---|
| CN | 102646927 A | 8/2012 |
| CN | 104104011 A | 10/2014 |

* cited by examiner

All of arrayed on/off
switches turn off

One of arrayed on/off
switches turns on

ARRAYED WAVEGUIDE GRATING BASED HYBRID INTEGRATED LASER HAVING ADJUSTABLE EXTERNAL CAVITY

CROSS REFERENCE TO RELATED APPLICATIONS

The present application is a national phase entry under 35 U.S.C. § 371 of International Application No. PCT/CN2014/095333, filed Dec. 29, 2014, which claims priority from Chinese Patent Application No. 201410802244.1 filed Dec. 19, 2014, all of which are hereby incorporated herein by reference.

FIELD OF THE INVENTION

The present invention relates to an external cavity adjustable hybrid integrated laser based on an arrayed waveguide grating and, in particular, to an external cavity adjustable hybrid integrated laser including a semiconductor gain die and a silicon based optical waveguide device chip. The laser of the present invention can be used in the field of optical communication.

BACKGROUND OF THE INVENTION

In recent years, with continuous increasing of demand for network applications, especially rapid development of high definition video services and high speed data services, requirement on network bandwidth becomes much higher. The conventional communication system is being developed towards 100 G bit/s or even 400 G bit/s. In a high speed DWDM communication system, a tunable laser of high performance plays an important role, and a high speed coherent communication system needs tunable lasers that meet characteristic requirements such as broad tuning range, stability in high frequency, narrow line width, high power, low power consumption, small volume and the like.

At present, the tunable lasers that meet the above characteristic requirements mainly include a monolithic integrated semiconductor tunable laser, an external cavity adjustable laser and a silicon based laser or the like. The monolithic integrated semiconductor tunable laser implements tuning of wavelength by changing refractive index of grating area or changing temperature of die. It has advantages of small volume, good stability and the like, and has been applied in commercial products used in a high speed multi-channel coherent communication system. However, technique for a monolithic integrated multi-section waveguide is very complicated, and fabrication of a grating with complex structure is even more difficult, so that the monolithic integrated semiconductor tunable laser cannot be mass produced with a low cost. A conventional external cavity adjustable laser may select different oscillating wavelengths by changing position of a diffraction grating for the external cavity in a mechanical way. It has advantages such as large tuning range, narrow line width and the like, and is also applied in commercial products used in the high speed multi-channel coherent communication system. However, the conventional external cavity adjustable laser has a relatively large volume and miniaturization thereof is difficult. In order to satisfy requirements of practical application, a micro-mechanical tuning device has been proposed in recent years, which has a greatly reduced volume and a high tuning speed, but a poor stability. The silicon based photoelectric integration device has a very attractive future. However, as silicon is an indirect band gap material which has very low luminous efficiency, research of the silicon based light emitting device has encountered difficulties that are almost impossible to overcome. Emergence of silicon based hybrid laser brings great inspiration to research of silicon based photonics, and with in-depth study on the silicon based photon device, break-though progresses have been made on researches of silicon based long wavelength detector, silicon based optical modulator, and optical switch. However, as compared with other silicon based photon device, silicon based luminescence device and laser still need further development. Nowadays, a popular concept is to integrate a III-V laser gain die and a silicon based optical waveguide chip to construct a hybrid external cavity laser. The present application proposes a technical solution of an arrayed waveguide grating based hybrid integrated laser having adjustable external cavity, which produces a tunable laser by coupling of end surfaces of the optical waveguide chip and the semiconductor gain die. The technical solution can overcome limitations of complex process for the monolithic integrated semiconductor laser. Meanwhile, since the external cavity uses an integrated chip, the technical solution can solve the problem of poor stability with the conventional external cavity adjustable laser caused by the external cavity including a number of components. In addition, the laser of the proposed structure has a higher integration level, which improves efficiency of coupling package and benefits the subsequent mass manufacture.

SUMMARY OF THE INVENTION

An object of the present invention is to obtain an arrayed waveguide grating based hybrid integrated laser having adjustable external cavity by coupling end surfaces of a semiconductor gain die and an arrayed waveguide grating based optical waveguide chip. The hybrid integrated laser has advantages such as good stability, narrow line width, ease of integration and the like.

The present invention may be implemented as follows:

1. The external cavity adjustable laser is constructed by coupling end surfaces of the semiconductor gain die and the arrayed waveguide grating based optical waveguide chip. The laser is mainly constituted by components of an optical waveguide device chip having an arrayed waveguide grating and an arrayed waveguide reflection-controllable component, the semiconductor gain die, a collimation coupling lens, an optical isolator, a beam splitter, an optical detector, an output coupling lens, an output optical fiber, a semiconductor cooler, a thermo resistor, and a control and driving unit.

2. The arrayed waveguide reflection-controllable component in the arrayed waveguide grating based optical waveguide chip may control loss in the resonant cavity of the laser in different wavelength channels so as to change the output wavelength of the laser.

3. The arrayed waveguide reflection-controllable component may have an arrayed on/off switches structure, and each switch may have its straight waveguide end surface coated with a high reflection film. This end surface and an end surface of the semiconductor gain die coated with a high reflection film define the resonant cavity of the laser. When the arrayed switches are all in an off status, the loss in the resonant cavity is high for each channel, and none of the channels satisfies the start-oscillation condition of the laser so that the laser does not provide a laser output. When driving condition of one of the switches for a certain channel is changed to the on status so that the certain channel has a reduced loss in the resonant cavity, only this channel satisfies the start-oscillation condition, and the laser outputs laser having a wavelength corresponding to the channel of the arrayed waveguide grating.

4. The arrayed waveguide reflection-controllable component may comprise a controllable arrayed Bragg grating. In order to prevent reflection on the end surface, each Bragg grating may have its straight waveguide end surface coated with an anti-reflection film. Each Bragg grating and the end surface of the semiconductor gain die coated with the high-reflection film define the resonant cavity of the laser. In an initial driving condition, the center wavelength of each Bragg grating deviates from the center wavelength of the corresponding channel of the arrayed waveguide grating. As the Bragg grating has a low reflectivity at the center wavelength of the array waveguide grating and an effective reflection cannot be obtained, the laser cannot reach the start-oscillation condition, and there is no laser output. The driving condition may be changed to adjust the center wavelength of a certain Bragg grating to be consistent with the center wavelength of the corresponding arrayed waveguide grating, resulting in a laser output having a wavelength corresponding to the channel.

5. In order to reduce power consumption of the laser and simplify control logic, the arrayed waveguide grating in the laser may adopt an athermal arrayed waveguide grating, and its output channel interval may be determined by the system channel interval of the laser.

6. The driving current of the gain die may be adjusted by using the photocurrent fedback from the optical detector of the laser to achieve tunable output power of the laser.

7. Real-time variation of the photocurrent of the optical detector in the laser reflects stability of output frequency of the laser. When variation of the photocurrent of the optical detector exceeds a certain threshold, phase of the laser may be adjusted to maintain stability of the output mode of the laser. Phase tuning of the laser may be implemented by adjusting current of the semiconductor gain die or changing the temperature of the semiconductor cooler below the semiconductor gain die, or by adding thermo-optical phasing element in the straight waveguide part of the optical waveguide device chip.

The present invention provides an arrayed waveguide grating based hybrid integrated laser having adjustable external cavity comprising an optical waveguide chip and a semiconductor gain die, the optical waveguide chip including an arrayed waveguide grating and an arrayed waveguide reflection-controllable component, the arrayed waveguide reflection-controllable component including a plurality of controllable devices, and the arrayed waveguide grating optically connecting the plurality of controllable devices to the semiconductor gain die;

Two end surfaces of the semiconductor gain die being coated with partial reflection film and anti-reflection film respectively, the optical waveguide chip being positioned at the anti-reflection film side of the semiconductor gain die to form an external cavity of the external cavity adjustable laser, the partial reflection film of the semiconductor gain chip and the arrayed waveguide reflection-controllable component forming the resonant cavity of the laser;

Each of the plurality of the controllable devices can change in-cavity loss of the resonant cavity or change reflection characteristic of the reflection end of the optical waveguide chip by adjusting external driving conditions, so as to implement wavelength tuning of the external cavity adjustable laser.

In the above-described technical solution, the external cavity adjustable laser may further comprise a coupling output circuit, an optical power detection device, and a control driving unit.

In the above-described technical solution, the coupling output circuit may comprise a collimation coupling lens, an optical isolator, and a output coupling lens, the collimation coupling lens collimating and coupling the laser beam outputted from the semiconductor gain die to the optical isolator, the output coupling lens being connected to the output optical fiber to couple the outputted laser beam to the output optical fiber;

The optical power detection device may comprise a beam splitter and an optical detector, the beam splitter being provided between the optical isolator and the output coupling lens to split the laser beam outputted from the optical isolator to the output coupling leans by a ratio to input into the optical detector;

The control driving unit may comprise a control driving device in connection with the optical waveguide chip, the semiconductor gain die, and the optical detector.

In the above-described technical solution, each of the controllable devices may comprise a controllable high attenuation device and a straight waveguide.

In the above-described technical solution, the controllable high attenuation device may comprise an optical switch, and an end surface of each straight waveguide may be coated with a high reflection film, the high reflection film of each straight waveguide and the partial reflection film of the semiconductor gain chip forming the resonant cavity of the laser, an on status of respective optical switches being controlled separately to make the resonant cavity corresponding to respective wavelengths reach a threshold condition to output a laser, thereby obtaining a laser with a corresponding wavelength.

In the above-described technical solution, each of the controllable devices may comprise a straight waveguide and a Bragg grating.

In the above-described technical solution, each of the straight waveguide may have an end surface coated with an anti-reflection film, and each Bragg grating and the partial reflection film of the semiconductor gain chip form the resonant cavity of the laser; the center wavelength of each arrayed Bragg grating deviates from the center wavelength of the corresponding port of the arrayed waveguide grating, and the center wavelength of respective Bragg gratings may be controlled separately to make the resonant cavities corresponding to respective wavelengths reach the threshold condition to output the laser, thereby obtaining the laser of the corresponding wavelength.

In the above-described technical solution, the Bragg grating may be fabricated by a phase mask process, and the Bragg grating has a material thermo-optic effect. The center wavelength of the Bragg grating may be controlled by a heating element.

In the above-described technical solution, the arrayed waveguide grating may comprise an athermal silicon based arrayed waveguide grating, which may have an output channel interval depending on the channel interval of the communication system in which it is applied.

In the above-described technical solution, the external cavity adjustable laser may further comprise a semiconductor cooler and a thermal resistor, and phase of the output laser may be controlled by adjusting current of the semiconductor gain die or changing temperature of the semiconductor cooler below the semiconductor gain die.

In the above-described technical solution, the straight waveguide part may be provided with a thermo-optic phasing element, and the phase of the output laser may be controlled by the thermo-optic phasing element.

In the above-described technical solution, the optical detector may feedback a photocurrent sample value to the control driving device, and the control driving device may calculate the current output power according to a pre-calibrated relationship between the output power of the laser and the photocurrent of the optical detector, compare the current output power with a target optical power, and adjust the current of the semiconductor gain die to make the output power of the laser reach the target optical power.

The present invention has the following advantages and positive effects:

1. The external cavity adjustable laser is formed by coupling end surfaces of the semiconductor gain die and the arrayed waveguide grating based optical waveguide chip. As compared with the conventional external cavity laser including a number of discrete elements, the laser of the present invention has advantages of high integration level, good mechanical stability and the like, which facilitates coupling package and mass manufacture.

2. By coupling the monolithic gain chip and the arrayed waveguide grating based optical waveguide chip and using light dispersion characteristic of the arrayed waveguide grating, the present invention may reduce complexity and cost of the device as compared with the conventional laser in which the arrayed gain chip is coupled with the silicon based optical waveguide chip.

REFERENCE SIGNS 1 optical waveguide chip;
1-1 arrayed waveguide grating;
1-2 controllable arrayed optical waveguide reflection component;
2 semiconductor gain die;
2-1 anti-reflection film;
2-2 partial reflection film;
3 collimation coupling lens;
4 optical isolator;
5 beam splitter;
6 optical detector;
7 output coupling lens;
8 output optical fiber;
9 semiconductor cooler;
10 thermal resistor;
11 control driving device;

DETAILED DESCRIPTION OF THE PREFERRED EMBODIMENTS

Hereinafter, the present invention will be further described in combination with the accompanying drawings and the embodiments.

Hybrid integration in the field of photoelectronics is a technical solution in which the active III-V semiconductor chip and the passive silicon based optical waveguide chip are integrated together, which can effectively solve the problem of low luminous efficiency due to the indirect band gap of silicon material and thus is widely accepted in the industry.

Figure 1:
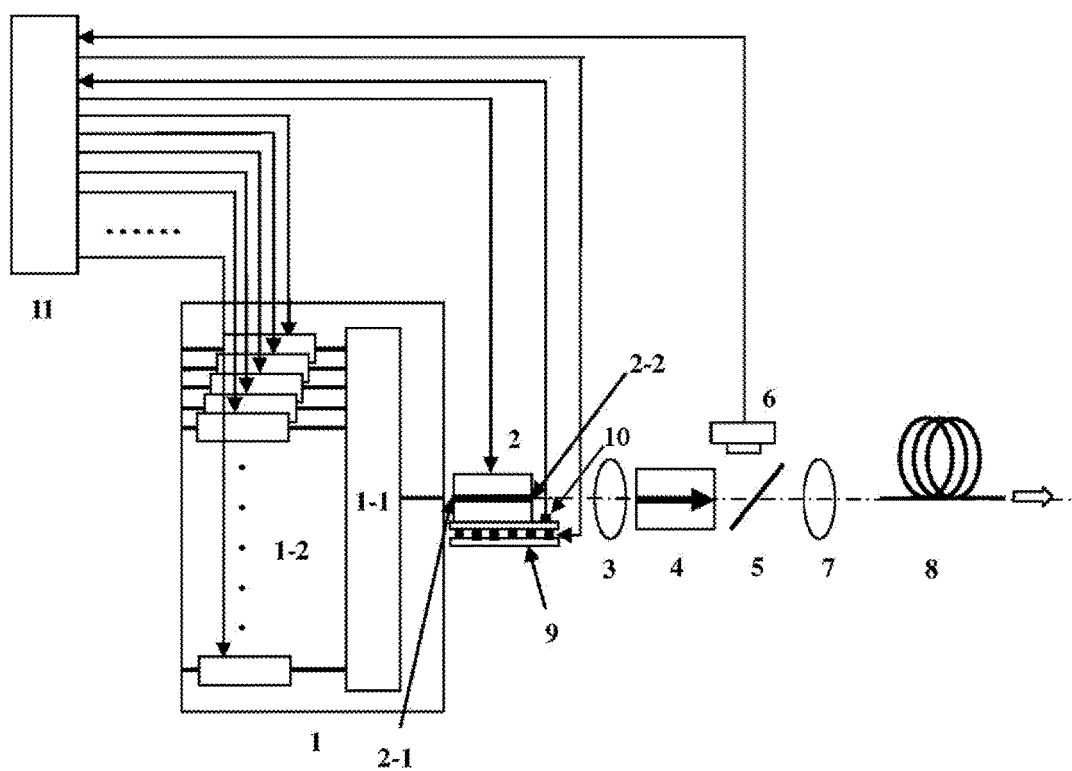
FIG. 1 is a structural diagram showing an arrayed waveguide grating based hybrid integrated laser having an adjustable external cavity.

Based on the above hybrid integration technique, the present invention proposes an arrayed waveguide grating based hybrid integrated laser having an adjustable external cavity, in which the external cavity adjustable laser is formed by coupling end surfaces of a passive silicon based optical waveguide chip and an active semiconductor gain die. As shown in FIG. 1, the hybrid integrated laser mainly includes the following functional modules: an external cavity adjustable laser, a coupling output circuit, an optical power detection device, and a control driving unit. The external cavity adjustable laser includes an optical waveguide chip 1, a semiconductor gain die 2, a semiconductor cooler 9, and a thermal resistor 10. The coupling output circuit includes a collimation coupling lens 3, an optical isolator 4, and an output coupling lens 7. The collimation coupling lens 3 collimates and couples the laser beam outputted from the semiconductor gain die 2 to the optical isolator 4, and the output coupling lens 7 is connected to the output optical fiber 8 to couple the output laser beam to the output optical fiber 8. The optical power detection device includes a beam splitter 5 and an optical detector 6. The beam splitter 5 is provided between the optical isolator 4 and the output coupling lens 7, splits off a portion of the laser beam outputted from the optical isolator 4 to the output coupling lens 7 by a ratio, and provides the split portion to the optical detector 6. The control driving unit includes a control driving device 11 in connection with the optical waveguide chip 1, the semiconductor gain die 2, the semiconductor cooler 9, and the thermal resistor 10 in the external cavity adjustable laser and the optical detector 6 in the optical power detection device.

The optical waveguide chip 1 preferably comprises a passive silicon based optical waveguide chip, and it may include an arrayed waveguide grating 1-1 and an arrayed waveguide reflection-controllable component 1-2. The arrayed waveguide grating 1-1 serves for filtering in the external cavity, and an end surface of the arrayed waveguide grating 1-1 coupled to the semiconductor gain die is coated with an anti-reflection film. To reduce power consumption and simplify control logic, the arrayed waveguide grating 1-1 preferably adopts an athermal arrayed waveguide grating. The arrayed waveguide reflection-controllable component 1-2 serves for wavelength tuning, and its reflection characteristic may be controlled by the control driving device 11.

The semiconductor gain die 2 provides gain for the laser, and two end surfaces thereof may be coated with a partial reflection film 2-2 and an anti-reflection film 2-1 respectively. The silicon based optical waveguide chip 1 is positioned at the anti-reflection film 2-1 side of the semiconductor gain die 2, forming the external cavity for the external cavity adjustable laser. The partial reflection film 2-2 of the semiconductor gain chip and the arrayed waveguide reflection-controllable component 1-2 form the resonant cavity of the laser. The semiconductor gain die 2 converts the current to spontaneous radiation photon of wideband by photoelectric conversion, and the photon propagates to both sides along the waveguide. A part of the photon having a specific frequency propagates back and forth in the resonant cavity of the laser many times until the threshold condition is satisfied, resulting in oscillation amplification and obtaining a laser beam emitted from the partial reflection film 2-2 of the semiconductor gain die 2.

The arrayed waveguide grating 1-1 may have a 1×N configuration, where N corresponds to the number of the wavelength channels, and it may be, for example, 48, 96 or the like. Each wavelength channel may have a center wavelength corresponding to a channel in the DWDM optical communication system. It would be appreciated that the present invention is not limited to any particular number of wavelength channels. In other words, the present invention may have a configuration including any number of wavelength channels. In the 1×N configuration, the port 1 is the wave aggregation port, and the port N is the wave division port. When a light beam including a plurality of wavelengths is inputted to the port 1, respective wavelengths would be outputted at the corresponding wave division ports. The present invention takes advantages of such a characteristic of the arrayed waveguide grating to implement wavelength tuning and selection function of the laser by forming the laser resonant cavity with the silicon based optical waveguide chip 1 and the semiconductor gain die 2 and selecting a desired wavelength at the N wave division ports (divided wave output ports) to reflect and generate a laser beam. Since the respective wavelengths are decided by the arrayed waveguide grating, the arrayed waveguide grating may select a wavelength in consistence with the DWDM system (or other wave division optical communication system) so as to obtain a desired laser center wavelength with high precision.

The controllable arrayed optical waveguides reflection component 1-2 in the optical waveguide chip 1 may include a plurality of controllable devices, which can change loss in the resonant cavity or, in other words, change reflection characteristic of the reflection end of the passive silicon based optical waveguide chip by adjusting the external driving condition. Each controllable device is connected to a corresponding wave division output port of the arrayed waveguide grating 1-1, and the wave aggregation input end of the arrayed waveguide grating 1-1 (the end surface coated with the anti-reflection film) is coupled to the end surface of the semiconductor gain die 2 forming the external cavity laser. The controllable devices in the controllable arrayed optical waveguide reflection component 1-2 may be controlled such that at any time only one of the output ends of the arrayed waveguide grating satisfies resonant condition of the laser to generate output laser beam. Thus, the laser may implement the multi-channel tunable function by changing the driving condition of the controllable arrayed optical waveguide reflection component 1-2 to output a laser beam corresponding to the respective channel wavelength of the arrayed waveguide grating 1-1.

The control driving device 11 may the semiconductor cooler 9 and the thermal resistor 10 to adjust temperature of the semiconductor gain die 2.

The beam splitter 5 splits off a small portion from the laser beam outputted by the semiconductor gain die 2 and provides the small portion to the optical detector 6. The optical detector 6 detects the optical power and provides the optical power as a measurement signal to the control driving device 11, forming a close feedback control loop to implement output stability monitoring and optical power adjusting function of the laser.

Figure 2:
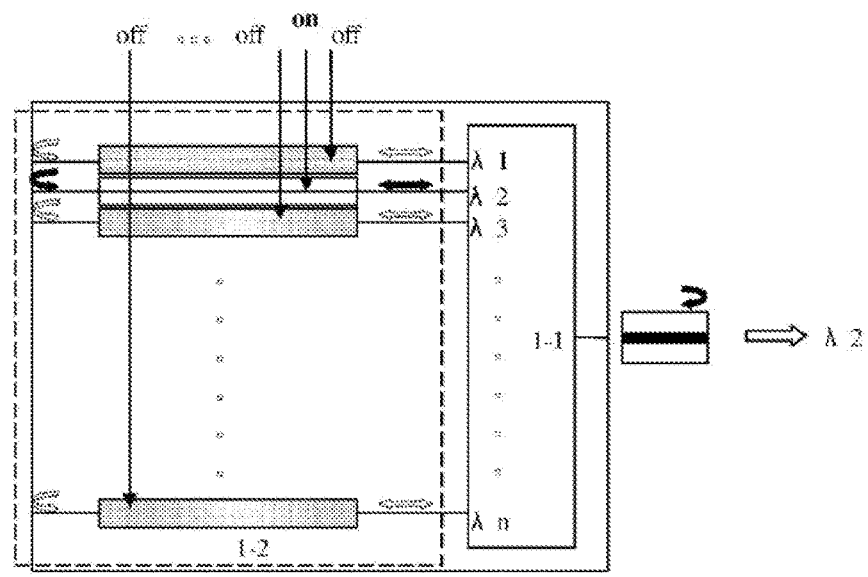
FIG. 2 is a structural diagram showing the arrayed waveguide reflection-controllable component adopting an arrayed on/off switches scheme.

The external cavity adjustable laser of the present invention can implement laser wavelength tuning function by various structural forms of the controllable arrayed optical waveguide reflection component. FIG. 2 illustrates a typical structure of the arrayed waveguide reflection-controllable component 1-2 in the optical waveguide chip 1 adopting an arrayed switches scheme. That is, each controllable device in the controllable arrayed optical waveguide reflection component 1-2 may be constituted by a switch plus a straight waveguide. Each wave division output end of the arrayed waveguide grating 1-1 is connected with a switch plus straight waveguide, and the straight waveguides, which are arranged in array, each has its end surface coated with a high reflection film. The end surface of each straight waveguide and the partial reflection film 2-2 of the semiconductor gain chip 2 form the resonant cavity of the laser. Assume that respective wave division output ends corresponding to the arrayed waveguide grating 1-1 have center wavelengths $\lambda 1$, $\lambda 2$, $\lambda 3$ . . . $\lambda n$ respectively, and the corresponding switches are S1, S2, S3 . . . Sn respectively. In an initial driving condition, the arrayed switches are all in an off status, and all of the wave division output ends of the arrayed waveguide grating 1-1 have a large loss in the resonant cavity so that the laser cannot reach the threshold condition to output a laser beam. Then, when one of the switches, e.g., S2, is turned on, loss in the resonant cavity corresponding to the wavelength $\lambda 2$ is reduced so that the threshold condition to output a laser beam is met, thereby outputting the laser beam having wavelength $\lambda 2$. On the other hand, other channels corresponding to their respective wavelengths do not generate a laser beam as the corresponding switches are in the off status and the in-cavity loss is too large. As such, a laser beam of desirable wavelength can be obtained by the control driving device 11 separately controlling the respective switches.

Figure 3:
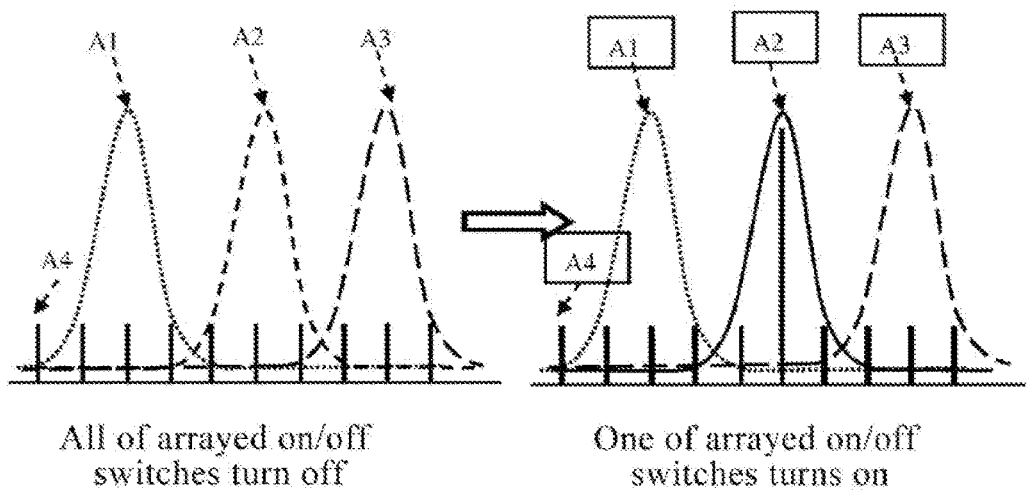
FIG. 3 is a principal diagram showing wavelength tuning of the arrayed waveguide reflection-controllable component adopting the arrayed on/off switches scheme.

A tuning principal diagram of this configuration is shown in FIG. 3 in which A1, A2 and A3 are transmission spectra of the wave division output ports 1, 2 and 3 of the arrayed waveguide grating 1-1 respectively, and A4 is the longitudinal mode of the laser. When the arrayed switches are all in the off status, the optical loss in the external cavity is very large, and there is no laser output. When the switch S2 is on and other channels are in the off status, the optical loss of the channel corresponding to the switch S2 is minimal at the wavelength $\lambda 2$, one of the longitudinal modes of which the wavelength is closest to $\lambda 2$ obtains a gain, and a laser beam of wavelength $\lambda 2$ is generated.

Those skilled in the art can understand that, the on/off switches in the exemplary structure shown in FIG. 2 and FIG. 3 can be replaced by any controllable high attenuation device, which may be controlled to be in a high attenuation status that corresponds to the off status of the switch, or in a low attenuation status that corresponds to the on status of the switch.

Figure 4:
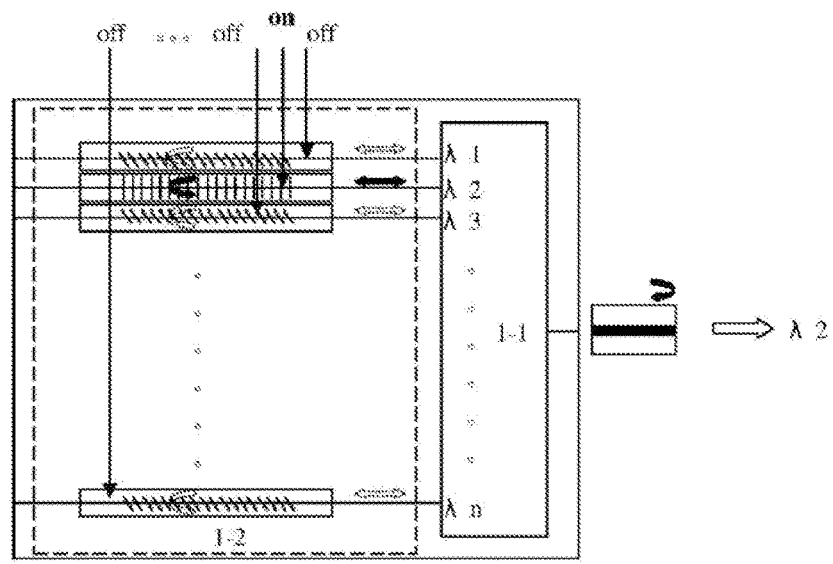
FIG. 4 is a structural diagram showing the arrayed waveguide reflection-controllable component adopting the arrayed waveguide grating scheme.

The optical waveguide chip 1 in the external cavity laser may also adopt a structure comprising the arrayed waveguide grating and the arrayed straight waveguides plus arrayed Bragg gratings as shown in FIG. 4. That is, each controllable device in the controllable arrayed optical waveguide reflection component 1-2 is constituted by a straight waveguide plus a Bragg grating. The structure of the arrayed waveguide grating and the arrayed straight waveguide plus arrayed Bragg grating preferably extends along the N output ends of the arrayed waveguide grating, and the straight waveguide with the high reflection Bragg reflection grating is disposed at the extension part. Each output end of the arrayed waveguide grating 1-1 is connected with a Bragg grating, and the end surface of the straight waveguide at the other end of the Bragg grating is coated with the anti-reflection film. The Bragg grating and the partial reflection film 2-2 of the semiconductor gain die 2 constitute the resonant cavity of the laser. Each Bragg grating is designed to have a center wavelength deviating from a center wavelength of a corresponding port of the arrayed waveguide grating 1-1 so that normally none of the ports functions to reflect light. For example, when the respective wave division output ends of the arrayed waveguide grating 1-1 have the center wavelengths $\lambda 1, \lambda 2, \lambda 3, \ldots, \lambda n$ respectively, the corresponding arrayed Bragg gratings have the center wavelengths $\lambda 1+\Delta\lambda, \lambda 2+\Delta\lambda, \lambda 3+\Delta\lambda, \ldots, \lambda n+\Delta\lambda$ respectively in the initial driving condition. Since the center wavelength of the wave division output end of the arrayed waveguide grating 1-1 does not correspond to the center wavelength of the arrayed Bragg grating, reflectivity of the Bragg grating at the center wavelength of the respective channel of the arrayed waveguide grating is not strong enough to reach the threshold condition to generate a laser beam, and there is no laser output. If the driving condition of the Bragg grating in a certain channel, e.g., the channel 2, is changed to make its center wavelength change from $\lambda 2+\Delta\lambda$ to $\lambda 2$, the center wavelength of the Bragg grating in this channel is equal to the center wavelength of the corresponding second channel in the arrayed waveguide grating 1-1, and the resonant cavity has a low loss at the wavelength $\lambda 2$, generating a laser beam of wavelength $\lambda 2$. The controllable arrayed Bragg grating may be implemented using thermo-optic effect of material, and the center wavelength of each Bragg grating may be controlled by one or more heating element. When temperature of the heating element changes, a refractive index of the material also changes, and thus the center wavelength of the Bragg grating changes. The external cavity laser can implement wavelength tuning by changing the driving conditions of the Bragg gratings.

Figure 5:
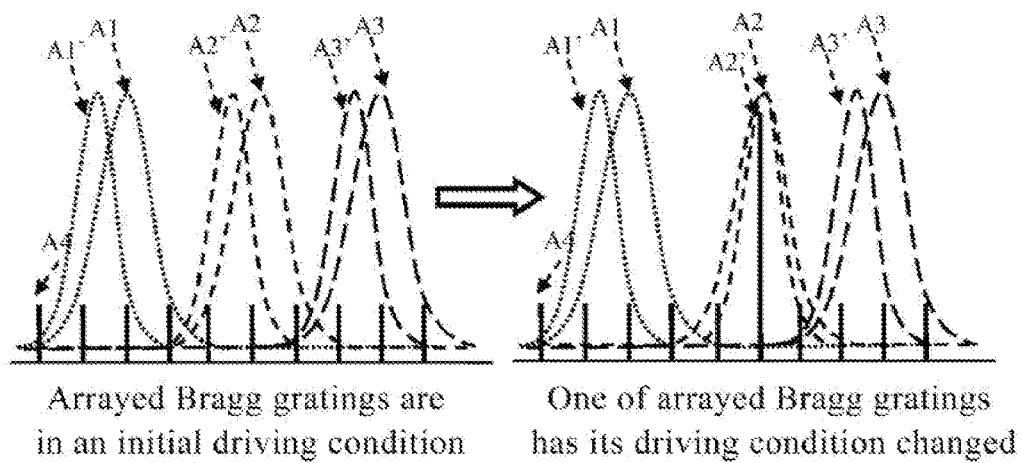
FIG. 5 is a principal diagram showing wavelength tuning of the arrayed waveguide reflection-controllable component adopting the arrayed waveguide grating scheme.

A principle diagram of this configuration is shown in FIG. 5, in which A1, A2 and A3 are transmission spectra of respective channels of the arrayed waveguide grating 1-1 respectively, A1', A2' and A3' are reflectance spectra of the Bragg gratings of respective channels of the corresponding arrayed waveguide grating 1-1 respectively, and A4 is the resonance longitudinal mode of the laser. In an initial driving condition, A1, A2 and A3 do not correspond to wavelengths of A1', A2' and A3', and the laser has a low reflectivity at $\lambda 1$, $\lambda 2$ and $\lambda 3$ so that it cannot reach the laser oscillation condition. When the driving condition of the Bragg grating for the second channel in the arrayed Bragg grating changes to make the center wavelength of the Bragg grating be corresponding to a maximum value of the transmission index of A2, the laser generate a laser output of wavelength $\lambda 2$. As compared with the configuration of FIG. 2, this configuration implement filtering twice by the arrayed waveguide grating and the Bragg grating, and the external cavity has a narrower filtering band which is beneficial for mode stability of the laser.

In order to avoid deterioration of characteristics of the laser due to mode hoping caused by various factors, and to achieve a stable output mode of the laser, the laser as described above may further have a mode locking function. A mode locking process is shown in the principal diagram of FIG. 6, which includes the following steps.

1. The control driving device 11 receives a command to switch wavelength, and in response to the command, it changes the driving condition of the arrayed waveguide reflection-controllable component 1-2 of the laser to output a laser beam of the corresponding wavelength.

Figure 6:
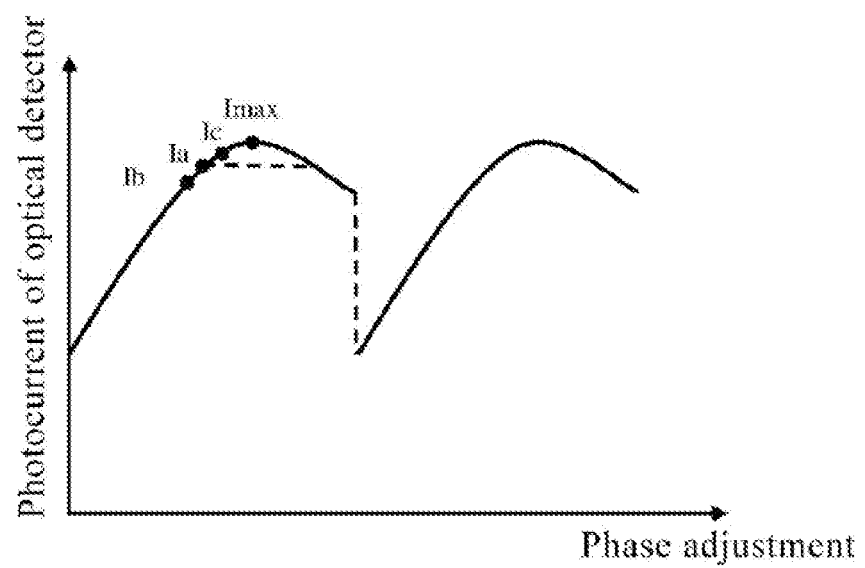
FIG. 6 is a principal diagram showing a mode locking process of the laser.

2. The phasing element of the laser is adjusted gradually, and corresponding photocurrent value of the optical detector is recorded, thereby obtaining relationship between the phase and the photocurrent as shown in FIG. 6. In FIG. 6, Imax represents a maximum value point of the photocurrent in one phase cycle, i.e., an operating point wherein the laser operates in a most stable mode in the mode locking algorithm. The laser is set to the best operating point Imax. Ia represents a threshold point set for the photocurrent adjustment.

3. The optical detector 6 samples the photocurrent I continuously, and the control driving device 11 compares the sampled photocurrent I with Imax and Ia. If I<Ia, for example, I is at the point Ib as shown in FIG. 6, the phasing element is adjusted in a small range until I has a current maximum value Imax'. The laser is set to the new best operating point Imax'. If Ia<I<Imax, for example, I is at the point Ic as shown in FIG. 6, it is considered that the laser is operating stably, and the driving condition of the laser does not need to be changed.

The phase tuning of the laser can be implemented by adjusting the current of the semiconductor gain die 2 or changing the temperature of the semiconductor cooler 9 below the semiconductor gain die 2; or by adding a thermo-optical phasing element at the straight waveguide part of the optical waveguide device chip 1.

The external cavity laser of the present invention has a power tuning function that is implemented by the optical detector 6, the control driving device 11 and the semiconductor gain die 2 in cooperation with each other. Before the laser is put into practice use, a correspondence relationship between the output optical power of the laser and the photocurrent of the optical detector is measured to calibrate the optical detector. When the laser is in use, if an operation to adjust output optical power needs to be executed, the user may set a target optical power first. The control driving device 11 receives the setting command, reads a sample value of current photocurrent of the optical detector 6, calculates current output power according to the correspondence relationship between the output optical power of the laser and the photocurrent of the optical detector calibrated in advance, compares the current output optical power value and the target optical power value, selects an appropriate step length to adjust the driving current of the semiconductor gain die 2, and executes the above-described mode locking process to ensure output stability of the laser. The control driving device 11 reads a sample value of the photocurrent of the optical detector and converts it into the current optical power value, compares the current optical power value with the target light power until the output optical power is close to the target optical power value.

In general, the arrayed waveguide grating based hybrid integration laser having adjustable external cavity according to embodiments of the present invention integrates the active III-V semiconductor chip and the passive silicon based optical waveguide chip to constitute the external cavity adjustable laser, which has advantages such as simple structure, high integration level, good stability, ease to mass manufacture and the like.

The above is only preferred embodiment of the present invention and is not for limiting the present invention, and the present invention can be made various kinds of modifications and variations for those skilled in the art. Any modification, equivalent replacement and improvement or the like made in the spirit and principle of the present invention falls into the range sought for protection by the present invention.

The invention claimed is:

1. An arrayed waveguide grating based hybrid integrated laser having adjustable external cavity, comprising:
an optical waveguide chip; and
a semiconductor gain die disposed downstream of the optical waveguide chip, wherein:
the optical waveguide chip includes an arrayed waveguide grating and an arrayed waveguide reflection-controllable component, the arrayed waveguide reflection-controllable component includes a plurality of controllable devices, and the arrayed waveguide grating optically connects the plurality of controllable devices to the semiconductor gain die;
two end surfaces of the semiconductor gain die are coated with a partial reflection film and an anti-reflection film respectively, the optical waveguide chip is positioned at the anti-reflection film side of the semiconductor gain die to form an external cavity of the external cavity adjustable laser, the partial reflection film of the semiconductor gain chip and the arrayed waveguide reflection-controllable component form the resonant cavity of the laser;
each of the plurality of the controllable devices is able to change an in-cavity loss of the resonant cavity or change reflection characteristic of the reflection end of the optical waveguide chip by adjusting external driving conditions, so as to implement wavelength tuning of the external cavity adjustable laser; and
wherein each of the controllable devices includes either:
(a) a controllable high attenuation device and a straight waveguide, wherein the controllable high attenuation device comprises an optical on/off switch, and an end surface of each straight waveguide is coated with a high reflection film, the high reflection film of each straight waveguide and the partial reflection film of the semiconductor gain chip form the resonant cavity of the laser, the respective optical on/off switches are controlled separately to be on to make the resonant cavity corresponding to respective wavelengths reach a threshold condition to output a laser beam, thereby obtaining the laser beam with the corresponding wavelength; or
(b) a straight waveguide and a Bragg grating, wherein each straight waveguide includes an end surface coated with an anti-reflection film, and each Bragg grating and the partial reflection film of the semiconductor gain chip form the resonant cavity of the laser, a center wavelength of each Bragg grating deviates from a center wavelength of the corresponding port of the arrayed waveguide grating to ensure that a signal of the center wavelength of the Bragg grating is unable to generate a laser output when no driving condition is implemented, and the center wavelength of the respective Bragg gratings are controlled separately to make the resonant cavities corresponding to respective wavelengths reach the threshold condition to output the laser, thereby obtaining the laser output of the corresponding wavelength.

2. The arrayed waveguide grating based hybrid integrated laser having adjustable external cavity of claim 1, further comprising a coupling output circuit, an optical power detection device, and a control driving unit.

3. The arrayed waveguide grating based hybrid integrated laser having adjustable external cavity of claim 2, wherein the coupling output circuit includes a collimation coupling lens, an optical isolator, and a output coupling lens, the collimation coupling lens collimates and couples a laser beam outputted from the semiconductor gain die to the optical isolator, the output coupling lens is connected to an output optical fiber to couple the outputted laser beam to the output optical fiber;
the optical power detection device includes a beam splitter and an optical detector, the beam splitter is provided between the optical isolator and the output coupling lens to split off a portion of the laser beam outputted from the optical isolator to the output coupling leans by a ratio and provide the split portion to the optical detector;
the control driving unit includes a control driving device in connection with the optical waveguide chip, the semiconductor gain die, and the optical detector.

4. The arrayed waveguide grating based hybrid integrated laser having adjustable external cavity of claim 1, wherein the Bragg grating is fabricated by a phase mask process, the Bragg grating has a material thermo-optic effect, and the center wavelength of the Bragg grating is controlled by a heating element.

5. The arrayed waveguide grating based hybrid integrated laser having adjustable external cavity of claim 1, wherein the arrayed waveguide grating comprises an a thermal silicon based arrayed waveguide grating, which has an output channel interval depending on the channel interval of the communication system in which it is applied.

6. The arrayed waveguide grating based hybrid integrated laser having adjustable external cavity of claim 1, further comprising a semiconductor cooler and a thermal resistor, wherein phase of the outputted laser beam is controlled by adjusting current of the semiconductor gain die or changing temperature of the semiconductor cooler below the semiconductor gain die.

7. The arrayed waveguide grating based hybrid integrated laser having adjustable external cavity of claim 1, wherein the straight waveguide is provided with a thermo-optic phasing element, and the phase of the outputted laser beam is controlled by the thermo-optic phasing element.

8. The arrayed waveguide grating based hybrid integrated laser having adjustable external cavity of claim 3, wherein the optical detector feeds back a current photocurrent sample value to the control driving device, and the control driving device calculate a current output power according to a pre-calibrated relationship between the output power of the laser and the photocurrent of the optical detector, compare the current output power with a target optical power, and adjust the current of the semiconductor gain die to make the output power of the laser reach the target optical power.

* * * * *